United States Patent [19]

Hara et al.

[11] Patent Number: 5,150,188
[45] Date of Patent: Sep. 22, 1992

[54] REFERENCE VOLTAGE GENERATING CIRCUIT DEVICE

[75] Inventors: Takahiko Hara; Syuso Fujii, both of Kawasaki, Japan

[73] Assignee: Kabushiki Kaisha Toshiba, Kawasaki, Japan

[21] Appl. No.: 620,030

[22] Filed: Nov. 30, 1990

[30] Foreign Application Priority Data

Nov. 30, 1989 [JP] Japan .................................. 1-311368

[51] Int. Cl.$^5$ .............................................. H01L 27/02
[52] U.S. Cl. .................................... 357/41; 357/23.9; 307/296.8
[58] Field of Search .................... 357/23.9, 23.12, 41; 307/304, 296.8, 296.1; 324/158 T

[56] References Cited

U.S. PATENT DOCUMENTS

| | | | |
|---|---|---|---|
| 4,670,706 | 6/1987 | Tobita | 307/304 |
| 4,716,313 | 12/1987 | Hori et al. | 307/296.8 |
| 4,916,389 | 4/1990 | Hori et al. | 324/158 T |
| 4,972,097 | 11/1990 | You | 307/296.8 |
| 5,008,609 | 4/1991 | Fukiage | 307/296.8 |
| 5,041,893 | 8/1991 | Nagai et al. | 357/23.12 |

FOREIGN PATENT DOCUMENTS

| | | | |
|---|---|---|---|
| 0063483 | 10/1982 | European Pat. Off. | 307/296.8 |
| 3722421 | 3/1988 | Fed. Rep. of Germany | 307/296.8 |
| 58-97714 | 6/1983 | Japan | 307/296.8 |
| 61-294527 | 12/1986 | Japan | 307/296.8 |
| 62-188255 | 8/1987 | Japan | 307/296.8 |
| 2-84761 | 3/1990 | Japan | 307/296.8 |

OTHER PUBLICATIONS

"Conference: Fifth European Solid State Circuits Conference, Esscirc 79 Southampton England" Sep. 18–21, 1979, MOS voltage reference based on polysilicon gate work function Difference by Oguey et al, pp. 28–30.

"An Experimental 1Mb DRAM with On-Chip Voltage Limiter", ISSCC 84, Feb. 24, 1984, Session XVIII: 256K/1Mb DRAMS-II 1984 IEEE Intern'l Solid-State Circuit Conference.

Primary Examiner—Rolf Hille
Assistant Examiner—Steven Loke
Attorney, Agent, or Firm—Oblon, Spivak, McClelland, Maier & Neustadt

[57] ABSTRACT

A reference voltage generating circuit device, which is integrally formed on a semiconductor substrate and an external supply voltage is applied thereto, includes a resistor having a first terminal connected to a first supply terminal, which becomes high potential, at least one diode connected between a second terminal of the resistor and a second supply terminal, which becomes low potential, in a forward direction, and at least one second diode connected to the resistor in parallel and connected to the first diode in series and a forward direction, wherein a reference voltage is generated from a node between the first diode and the second diode.

17 Claims, 4 Drawing Sheets

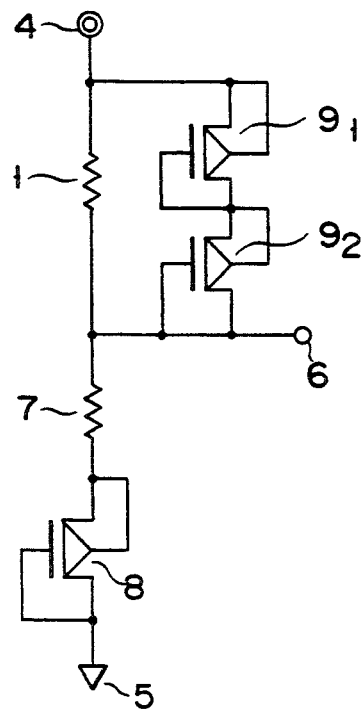
F I G. 5
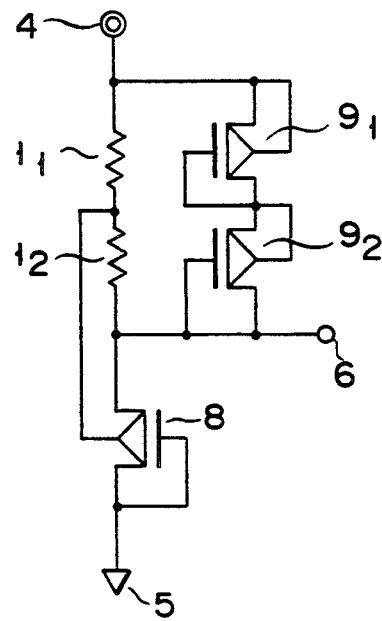
F I G. 6
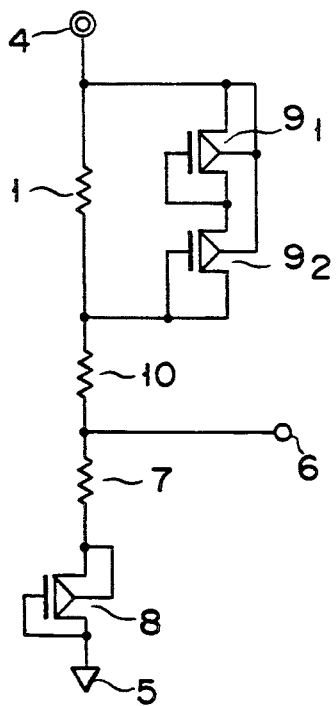
F I G. 7
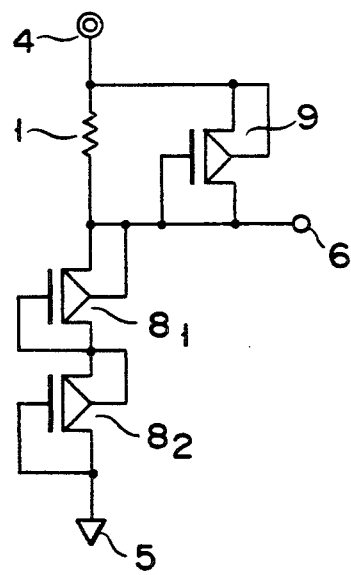
F I G. 8

REFERENCE VOLTAGE GENERATING CIRCUIT DEVICE

BACKGROUND OF THE INVENTION

1. Field of the Invention

The present invention relates to a reference voltage generating circuit device used in various kinds of semiconductor integrated circuits.

2. Description of the Related Art

With development of the semiconductor technique, particularly development of microminiaturization working technique, there has recently been an increasing tendency to the microminiaturization in the field of the semiconductor memory. Due to this, in consideration of reliability of the element and power dissipation of the chip, it is desirable that a power source voltage to be applied to the element be lowered.

In consideration of consistency with the system being used at present, it is desirable that a power source voltage Vcc (EXT) applied from the external portion of the chip can be used as it is for a user, who uses various kinds of systems using the semiconductor memories at present, even if the degree of integration of the semiconductor memory is increased. For this reason, there has been developed a technique in which a supply voltage limiting circuit is provided in the internal portion of the chip, thereby making the voltage applied to the element lower than the external supply voltage.

The supply voltage limiting circuit generally comprises a reference voltage generating circuit, which generates voltage serving as a reference voltage of an internal supply voltage of the chip, and an internal supply voltage output circuit, which keeps the internal supply voltage constant based on the output from the reference voltage generating circuit. Conventionally, in the reference voltage generating circuit, there is used a circuit wherein a resistor R and two diodes D1 and D2 are connected in series. According to this reference voltage generating circuit, if the forward voltage drop of the diodes is VF, a constant output of 2VF can be obtained. Also, if necessary, a higher reference voltage can be obtained by increasing the number of diodes.

However, in such a conventional reference voltage generating circuit, there occur problems when higher voltage is applied to the chip to perform a voltage accelerating test. More specifically, as a first problem, in order to perform the voltage accelerating test in the semiconductor memory wherein a supply voltage limiting circuit is incorporated, it is necessary to control the reference voltage generating circuit so as to obtain higher voltage than the chip internal supply voltage Vcc (INT) when the external supply voltage Vcc (EXT) becomes higher than a normal working voltage. In this case, the desirable relationship between the external supply voltage and the internal supply voltage is that the internal supply voltage Vcc (INT) shows a constant value when the external supply voltage Vcc (EXT) becomes higher than a certain value and the internal supply voltage Vcc (INT) increases again at a constant rate when the external supply voltage Vcc (EXT) becomes the maximum value Vcc max of the normal working voltage. However, in the conventional reference voltage generating circuit using diodes, since a constant reference voltage is generated regardless of the external supply voltage, the conventional reference voltage generating circuit cannot be used as the supply voltage limiting circuit explained above.

The second problem of the conventional reference voltage generating circuit is that stability of the characteristic is insufficient. More specifically, the forward voltage drop of the diode differs in the manufacturing process. Particularly, in a case where a plurality of diodes are connected in series, the influence exerted thereby cannot be avoided. Moreover, the forward voltage drop of the diode differs with temperature.

As mentioned above, there were problems in the reference voltage generating circuit used in the conventional integrated circuit when it was used as supply voltage limiting circuit to perform the voltage accelerating test.

SUMMARY OF THE INVENTION

An object of the present invention is to provide a reference voltage generating circuit, which is desirable for a supply voltage limiting circuit effectively operating when a voltage accelerating test is performed.

An object of the present invention is to provide a reference voltage generating circuit which comprises a resistor whose one terminal is connected to a first supply source terminal; one or more first diodes connected between the other terminal of the resistor and a second supply source terminal to have a forward polarity against supply voltage; and one or more second diodes connected in parallel to the resistor to have a forward polarity against supply voltage.

According to the reference voltage generating circuit of the present invention, when the supply voltage is swept, an output, which corresponds to 1:1, that is, the ratio of the supply voltage to the output voltage is obtained until the first diode is turned on. Thereafter, the output is kept to a constant value, which is determined by the first diode, up to a certain range. When the output exceeds the range and the second diode is turned on, an output, which responds to the change of the supply voltage, can be obtained by a rising rate, which is determined by a ratio of on-resistance of the first diode to that of the second diode. Therefore, there can be obtained a characteristic, which is desirable for the reference voltage generating circuit used as a supply voltage limiting circuit when a voltage accelerating test is performed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a circuit diagram of the reference voltage generating circuit of the other embodiment of the present invention wherein dependency on external supply voltage can be changed;

FIG. 6 is a circuit diagram of the reference voltage generating circuit of the other embodiment of the present invention wherein dependency on external supply voltage can be changed;

FIG. 7 is a circuit diagram of the reference voltage generating circuit of the other embodiment of the present invention wherein dependency on the output voltage and external supply voltage can be changed;

FIG. 8 is a circuit diagram of the reference voltage generating circuit of the other embodiment of the present invention wherein an output voltage rising region and an output voltage constant region can be arbitrarily changed;

DETAILED DESCRIPTION OF THE PREFERRED EMBODIMENTS

Figure 1:
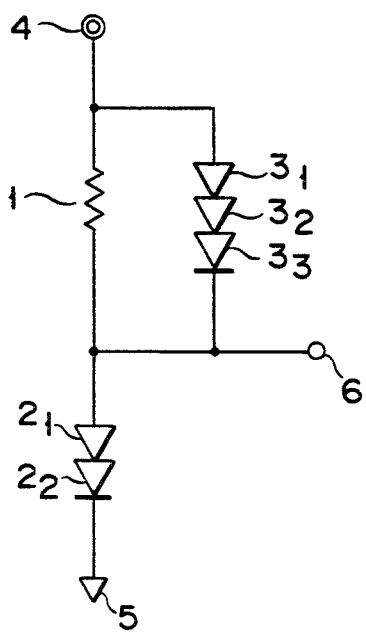
FIG. 1 is a view showing a reference voltage generating circuit of one embodiment of the present invention.

According to the embodiment shown in FIG. 1, a resistor 1 and two pn-junction diodes $2_1$ and $2_2$ are connected in series between a first supply terminal 4 to which external supply voltage Vcc (EXT) is applied and a second supply terminal 5, which is normally ground voltage. A node between the resistor 1 and the diode $2_1$ serves as an output terminal 6. Three pn-junction diodes $3_1$, $3_2$, and $3_3$ are connected in series between the first supply terminal 4 and the output terminal 6.

Figure 2:
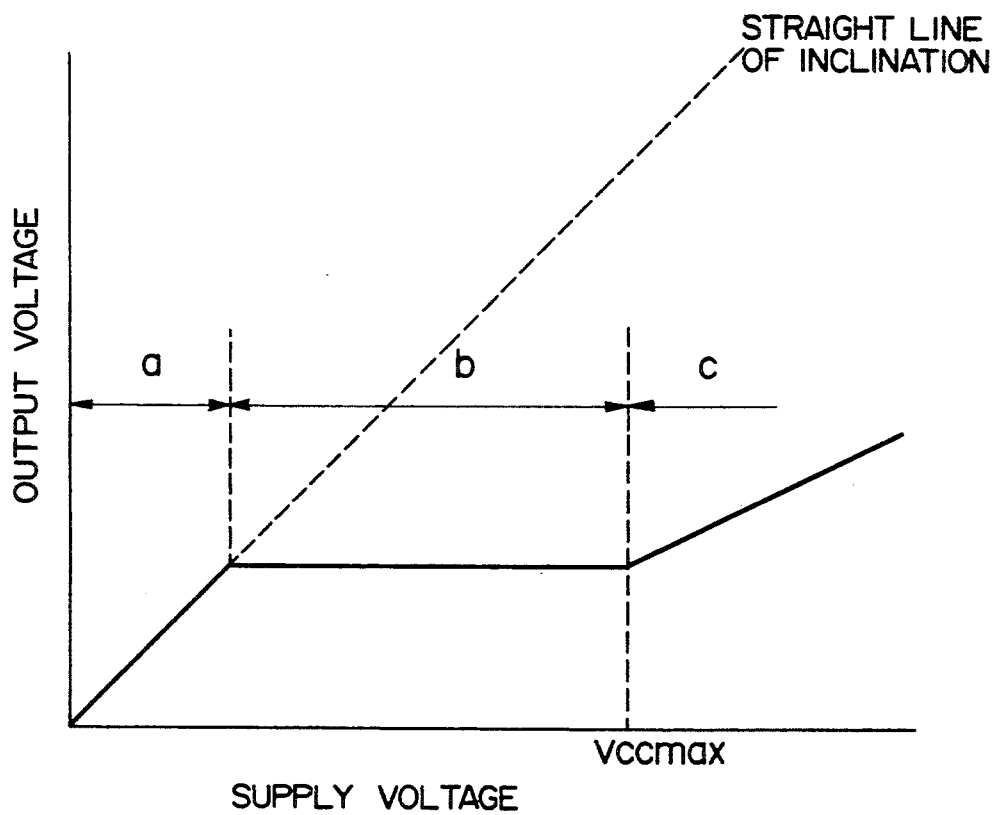
FIG. 2 is a view explaining the operation of the reference voltage generating circuit.

According to the above embodiment, in a region where supply voltage Vcc, which is applied from the external of the chip, is lower than twice the forward rising voltage VF of the pn-junction diode, pn-junction diodes $2_1$, $2_2$, $3_1$, $3_2$, and $3_3$ are turned off and an output voltage, which is equal to supply voltage Vcc, can be obtained in the output terminal 6 as shown in FIG. 2 (region a). If the supply voltage Vcc rises and pn-junction diodes $2_1$ and $2_2$ are turned on, a constant value, which is determined by the forward rising voltage of the pn-junction diodes $2_1$ and $2_2$, can be obtained in the output terminal 6 (region b). If the supply voltage Vcc rises more and pn-junction diodes $2_1$, $2_2$, $3_1$, $3_2$, and $3_3$ are turned on, a divisional voltage of supply voltage Vcc, which is determined by impedance ratio of pn-junction diodes $2_1$ and $2_2$ to pn-junction diodes $3_1$, $3_2$ and $3_3$, and which rises in response to supply voltage Vcc, is output (region c).

According to the above-mentioned reference voltage generating circuit, since the output voltage rises in accordance with the rise of the supply voltage, the voltage accelerating test can be performed.

Figure 3:
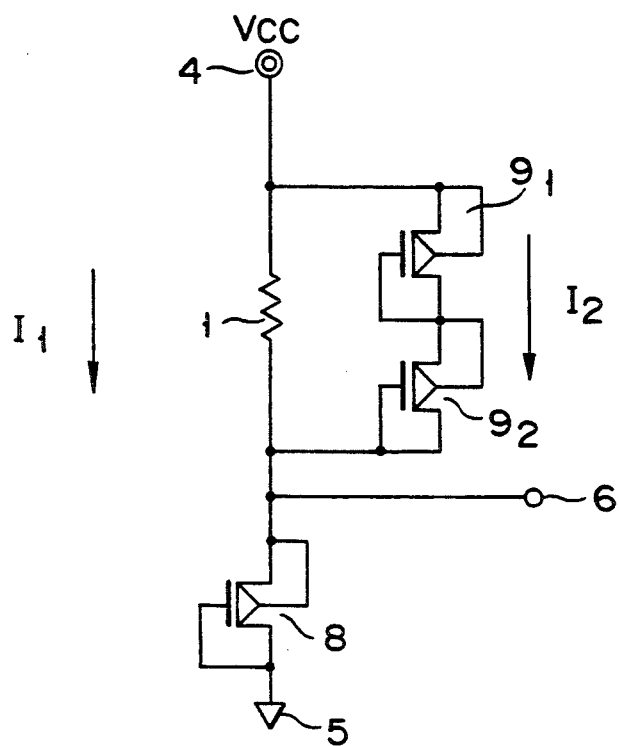
FIG. 3 is another embodiment showing a circuit diagram of a reference voltage generating circuit using a MOS transistor.

According to the reference voltage generating circuit of one embodiment of the present invention of FIG. 3, the resistor 1 and a p-channel MOS transistor 8 are connected in series between the first supply terminal 4 to which the external supply voltage Vcc (EXT) is applied and the second supply terminal 5, which is the normal ground voltage. The node between the resistor 1 and the p-channel MOS transistor 8 serves as the output terminal 6. The p-channel MOS transistor 8, to which a gate and drain are connected in common, used as a diode which has a forward characteristic with respect to a supply voltage. In other words, the gate and drain of MOS transistor 8 are connected to the second supply terminal 5 and the source and the substrate (or well) are connected to the resistor 1. Two p-channel MOS transistors $9_1$ and $9_2$ are connected in series between the first supply terminal 4 and the output terminal 6. Similar to the MOS transistor 8, in these transistors $9_1$ and $9_2$ the gate and drain are connected thereto in common to form the diode.

Figure 4:
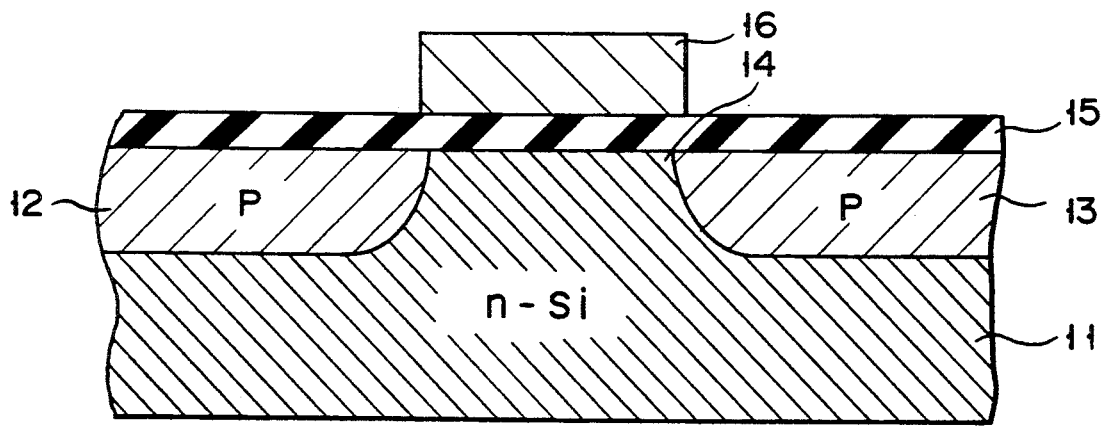
FIG. 4 is a view showing the structure of the MOS transistor used in the reference voltage generating circuit of FIG. 3.

FIG. 4 shows the structure of the cross sections of the respective MOS transistors 8, $9_1$, and $9_2$. According to the structure of these transistors, a p-type source region 12 and a drain region 13 are formed on an n-type silicon substrate (or well) 11, and a substrate region between the source region 12 and the drain region 13 are used as a channel region 14. Then, a gate electrode 16 is formed on the channel region 14 through a gate insulating film 15. No impurities are ion-implanted to the channel region 14. More specifically, for example, the substrate 11 has impurity concentration of $1 \times 10^{17}/cm^3$, the gate insulating film 15 is formed of a silicon oxide film of 160 Å, and the gate electrode 16 is formed of an n+ type polycrystal silicon. In other words, the channel region 14 does not include impurity of ion-implantation and has impurity concentration of $1 \times 10^{17}/cm^3$ which is substantially the same as the surface region of the substrate. Thereby, the threshold voltages Vth of MOS transistors 8, $9_1$, and $9_2$ become about $-1.8$ V and these MOS transistors 8, $9_1$ and $9_2$ show the characteristic of diode wherein the MOS transistors 8, $9_1$ and $9_2$ rise at threshold voltage Vth.

According to the embodiment, in the region where supply voltage Vcc, which is supplied from the external portion of the chip, is lower than threshold voltage $|Vth|$ of the MOS transistors 8, the MOS transistor 8 is turned off. Then, since MOS transistors $9_1$ and $9_2$ are turned off, an output, which is equal to the supply voltage Vcc, can be obtained in the output terminal 6 as shown in FIG. 2 (region a). If the supply voltage Vcc rises and the MOS transistor 8 is turned on, a constant value, which is determined by the threshold voltage $|Vth|$ of the MOS transistor 8, can be obtained in the output terminal 6 (region b). If the supply voltage Vcc further rises and MOS transistors $9_1$ and $9_2$ are turned on, a divisional voltage of supply voltage Vcc, which is determined by impedance ratio of the MOS transistor 8 to the MOS transistors $9_1$ and $9_2$, and which rises in response to supply voltage Vcc, can be obtained as an output voltage (region c).

As mentioned above, if the supply voltage limiting circuit comprises the reference voltage generating circuit of the embodiment and an internal voltage output circuit (described later), which is formed on the same substrate as used in the reference voltage generating circuit, the internal supply voltage can be increased in response to the external supply voltage when the voltage accelerating test is performed. Moreover, according to the above embodiment, since the reference voltage to be generated is the threshold voltage of the MOS transistor where impurity is not ion-implanted in the channel region, the reference voltage obtained by a plurality of pn-junction diodes shown in the embodiment of FIG. 1, can be obtained by one MOS transistor. Moreover, if the MOS transistor, in which no ion-implantation is performed in the channel region as explained in the embodiment, is used, the difference in the threshold voltage Vth in the manufacturing process is very small, thereby a stable reference voltage can be obtained. The MOS diode of the temperature dependency is smaller than the pn-junction diode.

FIG. 5 shows a reference voltage generating circuit of the other embodiment. According to this embodiment, a resistor 7 is added between the MOS transistor 8 and the output terminal 6 as compared with the embodiment of FIG. 3.

In the performance test of the semiconductor chip, there is often used a method in which various parameters such as access time are measured by changing the supply voltage. However, in the circuit of the above embodiment, since the voltage of the output terminal is constant in region b, the internal supply voltage of the semiconductor chip does not depend on the external supply voltage and becomes constant. Due to this, it is expected that the performance test of the semiconductor chip will be difficult to be performed. However, according to the embodiment of FIG. 5, since the resistor 7 is added to the circuit, the voltage of the output terminal 6 in region B can be slightly increased together with the rise of the external supply voltage. Therefore, the performance test of the semiconductor chip can be easily performed. Then, the dependency of the output voltage of the output terminal 6 upon the external supply voltage in region b can be changed by changing the resistance value. In other words, the external supply voltage dependency becomes larger as the resistance value of the resistor 7 is made higher. In order to exert the lenient supply voltage dependency on the reference voltage, the following method can be also considered:

More specifically, according to the embodiment of FIG. 3, the substrate (well) voltage of the MOS transistor 8 for the reference voltage generation is the same as the drain voltage. However, the substrate voltage is variously changed in the range up to the supply voltage, thereby the above-mentioned supply voltage dependency can be changed. For example, as shown in FIG. 6, the substrate voltage of the MOS transistor 8 may be obtained from the intermediate point of the resistor 1 connected between the supply terminal 4 and the output terminal 6. Accordingly, since the so-called substrate bias (back bias) is applied to the MOS transistor 8, the threshold voltage Vth holds the supply voltage dependency, so that the lenient supply voltage dependency can be exerted on the output voltage.

FIG. 7 shows an embodiment in which the embodiment of FIG. 5 is modified. According to this embodiment, a resistor 10 is connected between a node, to which the resistor 1 and the gate and drain of the MOS transistor 9₂ are connected, and the output terminal 6. Moreover, the substrate voltage of the MOS transistor 9₂ can be obtained from not the source of the MOS transistor 9₂ but the supply voltage Vcc. According to the abovementioned reference voltage generating circuit, the resistance value of the added resistor 10 is changed and the substrate voltage of the MOS transistor 9₂ is changed, thereby the value of the supply voltage in changing the voltage of the output terminal 6 from region b shown in FIG. 2 to region c and the external supply voltage dependency (voltage rising angle) can be adjusted. More specifically, in a case where the resistor 10 and the parameters other than the substrate voltage of the MOS transistor 9₂ are not changed, the supply voltage dependency in region c can be made small as the value of the resistor 10 is made larger. Moreover, as the substrate voltage of the MOS transistor 9₂ is made higher than the source voltage of the MOS transistor 9₂, the external supply voltage can be shifted to the high potential side when the voltage of the output terminal 6 changes from region b to region c.

In the above-mentioned embodiments, there are used one MOS transistor serving as the first diode for the reference voltage generation, and two MOS transistors serving as the second diode for determining the rising curve of the output voltage when the voltage acceleration is performed. The number of these transistors can be arbitrarily selected, depending on how the ranges of regions a and b of the output voltage are set.

For example, as shown in FIG. 8, the first diode may be formed of two MOS transistors 8₁ and 8₂, and the second diode may be formed of one MOS transistor 9.

Figure 9:
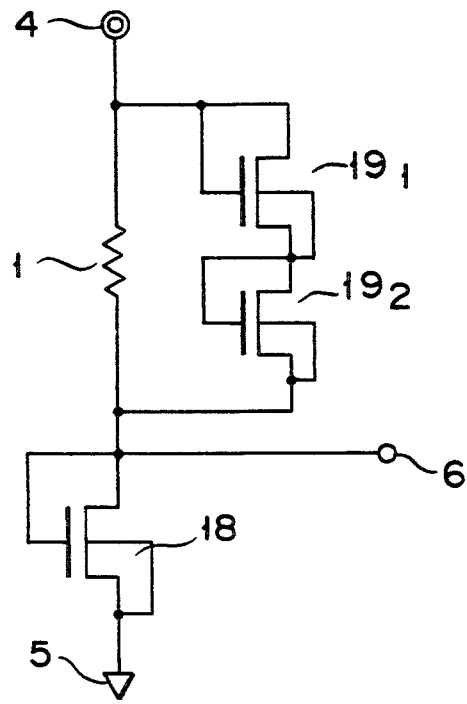
FIG. 9 is a circuit diagram of the reference voltage generating circuit of the other embodiment of the present invention wherein a MOS transistor of the other polarity type is used.

FIG. 9 shows an embodiment using an n-channel MOS transistor as a diode. More specifically, one n-channel MOS transistor 18 is used as the first diode for generating the reference voltage, and two n-channel MOS transistors 19₁ and 19₂ are used as the second diode. In this case, unlike the p-channel MOS transistor, in MOS transistors 18, 19₁ and 19₂, the gate and drain are connected to the high potential side as illustrated in FIG. 9. Thereby, the characteristic of the diode which rises at the threshold voltage can be obtained. As mentioned above, according to the present invention, not only a p-channel MOS transistor but also an n-channel MOS transistor can be used as a diode.

Figure 10:
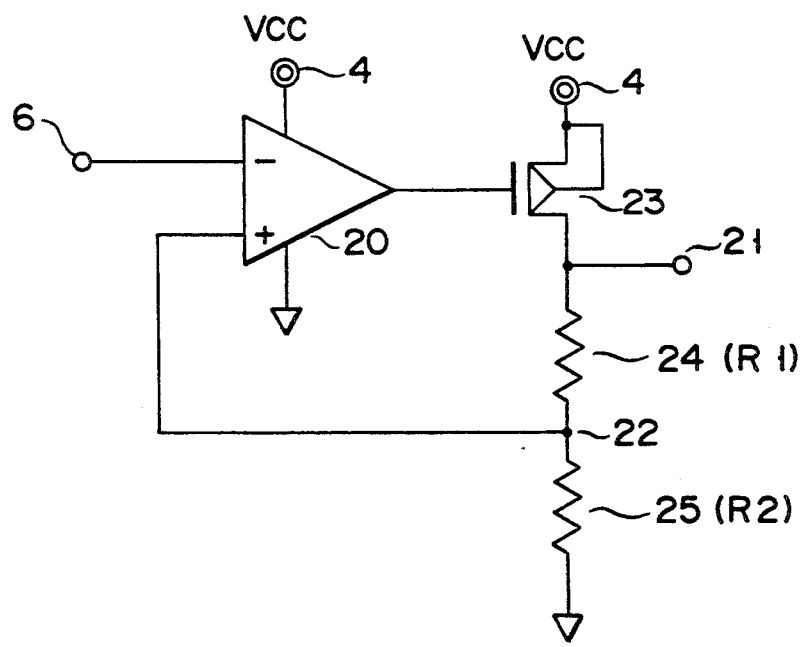
FIG. 10 is a circuit diagram of an internal voltage output circuit generating an internal supply voltage based on a reference voltage of the reference voltage generating circuit.

FIG. 10 shows an internal voltage output circuit which generates an internal supply voltage based on the reference voltage generated by the above reference voltage generating circuit.

In the internal voltage output circuit, a differential amplifier 20 is provided and a reverse input terminal of the differential amplifier 20 is connected to the output terminal of the reference voltage generating circuit, and the output terminal is connected to the gate of a p-channel MOS transistor 23. The drain of the MOS transistor 23 is connected to an internal supply output terminal 21. Resistors 24 and 25, which respectively have resistance values R1 and R2, are connected in series between the internal supply output terminal 21 and a grounding electrode. A node 22 between resistors 24 and 25 are connected to a non-reverse input terminal of the differential amplifier 20. Additionally, the differential amplifier 20 and the MOS transistor 23 are connected to the external supply through the supply terminal 4.

When reference voltage Vref is supplied to the internal voltage output circuit from the reference voltage generating circuit through the terminal 6, the internal voltage output circuit outputs the internal voltage of $[(R1+R2)/R2]Vref$. The internal voltage can be set to a desirable value in accordance with the reference voltage by arbitrarily selecting resistance values R1 and R2.

In the above embodiments, one of the first and second diodes may be formed of at least one pn-junction diode, and the other at least one MOS transistor.

As mentioned above, according to the present invention, there can be provided a reference voltage generating circuit which generates an output voltage suitable for a reference voltage of a supply voltage limiting circuit.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A reference voltage generating circuit device, which is integrally formed on a semiconductor substrate and connected between first and second supply terminals where an external supply voltage is applied, comprising:
   electrical resistor means having a first terminal connected to said first supply terminal, which has a first potential, and a second terminal;
   at least one first diode connected between the second terminal of said electrical resistor means and said second supply terminal, which has a second potential lower than the first potential, so as to have a forward characteristic with respect to said supply voltage; and
   at least one second diode connected to said electrical resistor means in parallel, connected to said first diode in series, and having an anode to which is applied a potential the same as the first potential so as to have the forward characteristic with respect to said supply voltage, wherein a node between said first diode and said second diode is connected to output terminal means.

2. A reference voltage generating circuit device according to claim 1, wherein each of said first and second diodes is formed of a MOS transistor having a gate and a drain which are connected to each other.

3. A reference voltage generating circuit device according to claim 1, wherein said first diode is formed of MOS transistor circuit means including one of at least one p-channel MOS transistor and at least one n-channel MOS transistor each having a gate and a drain, which are connected to each other and form one terminal of said first diode, and a source which forms the other terminal of said first diode, said one terminal being connected to said second supply terminal and said other terminal being connected to said resistor means.

4. A reference voltage generating circuit device according to claim 3, wherein said MOS transistor has a substrate voltage terminal and said resistor means has an intermediate terminal connected to the substrate voltage terminal of said MOS transistor.

5. A reference voltage generating circuit device according to claim 3, wherein said MOS transistor circuit means is formed of a plurality of MOS transistors connected in series.

6. A reference voltage generating circuit device according to claim 1, wherein said second diode is formed of MOS transistor circuit means having a gate and a drain, which are connected to each other and forming one terminal of said second diode and a source forming the other terminal of said second diode, said one terminal being connected to said resistor means and said other terminal being connected to said first supply terminal.

7. A reference voltage generating circuit according to claim 6, wherein said MOS transistor circuit means is formed of a plurality of MOS transistors connected in series.

8. A reference voltage generating circuit device according to claim 1, wherein said first diode is formed of MOS transistor circuit means including one of at least one p-channel MOS transistor and at least one n-channel MOS transistor each having a gate and a drain, which are connected to each other and form one terminal of said first diode, and a source which forms the other terminal of said first diode, said one terminal being connected to said second supply terminal and said other terminal being connected to said resistor means, and said second diode is formed of MOS transistor circuit means including one of at least one p-channel MOS transistor and at least one n-channel MOS transistor each having a gate and a drain, which are connected to each other and form one terminal of said second diode, and a source which forms the other terminal of said second diode, said one terminal of said second diode being connected to said resistor means and said other terminal of said second diode being connected to said first supply terminal.

9. A reference voltage generating circuit device according to claim 1, wherein an additional resistor is connected between said first diode and said second diode, thereby dependency on said external supply voltage can be changed.

10. A reference voltage generating circuit device, which is integrally formed on a semiconductor substrate and connected between first and second supply terminals across which an external supply voltage is applied, comprising:
    electrical resistor means having a first terminal connected to said first supply terminal, which has a first potential, and a second terminal;
    at least one first MOS transistor connected between the second terminal of said electrical resistor means and said second supply terminal, which has a second potential lower than the first potential, said first MOS transistor having a gate and a drain connected to each other to function as a forward diode;
    at least one second MOS transistor connected to said electrical resistor means in parallel and connected to said first MOS transistor in series, said second MOS transistor having a gate and a drain connected to each other to function as a forward diode, a potential the same as the first potential being applied to the gate and drain of said second MOS transistor; and
    output terminal means connected to a node between said first MOS transistor and said second MOS transistor.

11. A reference voltage generating circuit device according to claim 10, wherein said reference voltage generating circuit comprises a first resistor element connected between said resistor means and said output terminal means and as second resistor element connected between said output terminal means and said first MOS transistor.

12. A reference voltage generating circuit device according to claim 11, wherein said second MOS transistor has a substrate voltage terminal connected to said first supply terminal.

13. A reference voltage generating circuit device according to claim 10, wherein each of said first and second MOS transistors has a well region having a predetermined impurity concentration and a channel region having impurity concentration which is substantially the same as the impurity concentration of the well region.

14. A reference voltage generating circuit device according to claim 12, wherein each of said first and second MOS transistors has a gate insulating film formed of a silicon oxide film of 160 Å and a gate electrode formed of an n+ type polycrystal silicon film, and said channel region has impurity concentration of $1 \times 10^{17}/cm^3$.

15. A reference voltage generating circuit device according to claim 10, wherein said first MOS transistor has a substrate voltage terminal and said resistor means is formed of a resistor having an intermediate terminal connected to the substrate voltage terminal of said first MOS transistor.

16. A reference voltage generating circuit device according to claim 10, wherein an additional resistor is connected between said first MOS transistor and said second MOS transistor, thereby dependency on said external supply voltage can be changed.

17. A reference voltage generating circuit device integrally formed on a semiconductor substrate and connected between first and second supply terminals to which an external supply voltage is applied, comprising:
electrical resistor means having a first terminal connected to said first supply terminal, which has a first potential, and a second terminal; and
voltage generating means disposed across said first and second supply terminals and connected to said second terminal of said electrical resistor means for producing a substantially constant working voltage in a first predetermined voltage range, and for producing a variable voltage in a second predetermined voltage range, said second predetermined voltage range being consecutive to and greater in magnitude than said first predetermine voltage range.

* * * * *